United States Patent [19]

Lawson

[11] 4,101,322

[45] Jul. 18, 1978

[54] LITHOGRAPHIC PLATE INK RECEPTIVITY IMPROVING COMPOSITION AND METHOD

[75] Inventor: Leslie Edward Lawson, Orpington, England

[73] Assignee: Vickers Limited, London, England

[21] Appl. No.: 761,997

[22] Filed: Jan. 24, 1977

[30] Foreign Application Priority Data

Jan. 26, 1976 [GB] United Kingdom ................. 2951/76

[51] Int. Cl.[2] ................................................ G03F 7/02

[52] U.S. Cl. ........................................ 96/33; 101/466; 106/246; 106/268; 106/269; 106/285; 96/76 R

[58] Field of Search ............. 96/33, 76 R, 114, 115 R, 96/35; 106/2, 246, 278, 245, 268, 269, 285; 101/465, 466

[56] References Cited

PUBLICATIONS

Chemical Abstracts, vol. 72, (1970) 105876e.

*Primary Examiner*—John D. Welsh

*Attorney, Agent, or Firm*—Reed, Smith, Shaw & McClay

[57] ABSTRACT

A composition for improving the ink receptivity of lithographic printing images comprises an organic solvent liquid capable of softening the surface of the printing image and a film forming alkali-resistant oleophilic material such as a liquid hydrocarbon solution of a normally solid hydrocarbon or fat. The composition is for use in the case where the printing image is formed by alkaline development of an image-wise exposed radiation sensitive coating such as a phenol formaldehyde resin in admixture with a sensitiser. The composition may be applied before exposure to form an alkali resistant oleophilic layer on the radiation sensitive coating or it may be applied after image-wise exposure but before alkali development.

12 Claims, No Drawings

LITHOGRAPHIC PLATE INK RECEPTIVITY IMPROVING COMPOSITION AND METHOD

This invention relates to the inking of lithographic printing plates.

It is known to produce a lithographic printing plate by image-wise exposing a radiation sensitive plate which comprises a radiation sensitive layer on a suitable substrate and then developing the image-wise exposed layer to form a printing image on the substrate. It is known to use, as the radiation sensitive layer, sensitised alkali-soluble materials such as sensitised phenol-formaldehyde resins, e.g. novolak resins, in which case the image-wise exposed layer may be developed utilising an alkaline (pH > 11) developer. Since their introduction to the market in about 1958, there has always been a difficulty with lithographic printing plates carrying printing images based on such alkali-developed layers in that the printing image only takes ink with difficulty. Thus, when the plate is placed on the printing press, about 100 revolutions of the plate cylinder are generally needed before an adequately inked copy is produced. This causes a considerable wastage of paper and of press time. One way to avoid the wastage of paper and press time is by hand inking the plate but, as the printing image is so reluctant to accept ink, a long period of rubbing is essential. There are also physical difficulties in hand-inking the large (e.g. 2.0 × 1.25 meters) plates sometimes used.

The aforementioned deficiency applies not only to alkali developed positive-working printing plates based on e.g. orthoquinone diazides or diazonium salts as sensitisers but also to alkali developed negative-working plates based on e.g. azides as sensitisers. Whilst the reason for this deficiency is not completely understood, our researches indicate that a thin surface layer of oleophobic material, possibly alkali phenate, may be formed upon the image during development by reaction of the alkaline developer with the image material and that this oleophobic layer impairs the ink-receptivity of the image.

It is an object of the present invention to render more ink receptive the printing image of alkali developed printing plates.

According to one aspect of the present invention there is provided a composition for improving the ink receptivity of a lithographic printing plate having a printing image formed by alkali-development of an image-wise exposed radiation sensitive layer, which liquid comprises (i) an organic solvent liquid capable of softening the surface of the printing image and (ii) a film forming alkali-resistant oleophilic material.

The composition according to the invention will be hereinafter referred to as a "pre-inking liquid".

The nature of the organic solvent liquid in the pre-inking liquid is dependent on the image-forming material of the plate with which the pre-inking liquid is to be used. Examples of organic solvent liquids which have been found to be suitable in the formulation of pre-inking liquids for use with plates based on novolak resins sensitised with diazides or diazonium salts are alcohols such as ethanol, iso-propanol, n-butanol, 2-ethyl hexanol or 1-octanol, esters such as n-hexyl acetate, diethyl phthalate or diethyl carbonate, or ketones such as 2,6-dimethyl heptanone, 3-methyl-2-pentanone or 4-methyl-2-pentanone. The film-forming alkali resistant oleophilic material may be, for example, a normally solid hydrocarbon or fat in solution in a liquid hydrocarbon. Examples of suitable normally solid materials are asphaltum (gilsonite), naturally occurring waxes, paraffin waxes and/or fats such as tallow and examples of suitable liquid hydrocarbons are mineral oils and/or white spirit. The pre-inking liquid may include a conventional pigment and/or dye and can readily be formulated so that it is of low viscosity. Typically, the pre-inking liquid comprises from 5 to 25% by weight of normally solid hydrocarbon and/or fat, from 45 to 85% by weight of liquid hydrocarbon, from 2 to 20% by weight of the organic solvent liquid and up to 20% by weight of pigment and/or dye.

In use, the pre-inking liquid is generally applied over the whole of the plate surface after image-wise exposure but before development. The small amount of organic solvent liquid in the pre-inking liquid slightly softens the surface of the image and the oleophilic material forms a thin alkali-resistant, water repellent layer on the softened surface of the image. This layer apparently prevents the reaction of the image with the subsequently applied developer to form an oleophobic layer but, surprisingly, only slightly affects the developing action of the alkali developer.

Accordingly another aspect of the present invention provides a method of processing a radiation sensitive plate comprising a layer of radiation sensitive material which is developable by an alkaline developer after image-wise exposure which method comprises (a) image-wise exposing the radiation sensitive layer, (b) treating the image-wise exposed layer with a pre-inking liquid as hereinbefore defined, and (c) developing the treated layer with an alkaline developer to leave an image on the plate.

The method of the present invention has been found to be particularly applicable to the processing of plates incorporating as the radiation sensitive layer, an alkali soluble phenolformaldehyde resin sensitised with a diazide or a diazonium salt Since the pre-inking liquid may be of low viscosity and can be applied on its own whereas conventional image inking has to be carried out in the presence of an aqueous desensitiser solution it can be very readily and easily applied even to large plates.

The processed plate obtained in accordance with the method of the present invention may be inked and used per se or it may first be heated according to British Patent Specification No. 1,154,749 or more preferably in accordance with the process described in United States Patent Application No. 593,679, now abandoned, wherein a water soluble layer is provided on the plate to prevent contamination of the non-image areas of the plate during the heating step.

At the expense of a slightly longer exposure time, the pre-inking liquid may be applied to the radiation sensitive plate prior to exposure so as to form an alkali resistant oleophilic layer on the radiation sensitive layer. Thus, the pre-inking liquid may be applied by the manufacturer, rather than the user, of the radiation sensitive plate.

Accordingly, a further aspect of the present invention provides a radiation sensitive plate comprising a substrate; a coating on the substrate of a radiation sensitive material which is developable by an alkaline developer after image-wise exposure; and, on said coating, a layer of alkali resistant oleophilic material.

In the case where the pre-inking liquid includes a pigment and/or a dye, the area of the plate treated can be readily seen. However the pre-inking liquid may be colourless in the case where the liquid is to be applied by machine or where a change in gloss of the plate surface is apparent on application of the liquid.

The following Examples illustrate the invention.

EXAMPLE 1

A pre-inking liquid was prepared by grinding together:

4-methyl-2-pentanone; 10 g
asphaltum (gilsonite); 15 g
tallow; 1 g
calcium carbonate; 4 g
carbon black; 10 g
white spirit; 15 g
mineral oil; 45 g A positive-working plate consisting of a grained and anodised aluminium substrate coated with a radiation sensitive mixture of the bis- naphthoquinone diazide-(2)-5-sulphonic acid ester of 4,4'-dihydroxy-diphenylsulphone and a novolak resin was exposed in the usual way under a positive and wiped over with the above pre-inking liquid so as to form a thin uniform layer on one-half of the plate surface. The plate was developed with a silicate-containing developer of pH 12.8, rinsed, gum-etched in the usual manner and mounted on a lithographic press. Whereas the treated half gave fully inked prints after only five copies had been printed, the untreated half of the plate was not printing fully even after the production of seventy copies.

Further similar plates A, B and C were exposed and treated on one half of the plate only with the pre-inking liquid.

After development with the above developer and rinsing plate A was "burned-in" in an oven for 10 minutes at 230°, cleaned by rubbing with more developer, desensitised as before and mounted on the press. Once again the ready ink-acceptance of the treated half was noted.

Plate B, after development and rinsing in the above manner, was wiped over with an aqueous 20% solution of the sodium salt of a sulphonated alkyldiphenyl oxide to form a water soluble protective layer over the plate. The plate was then "burned-in" as in the case of plate A. After washing with water and desensitising, it was placed on the press and once again showed ready ink-acceptance (after 5 revolutions of the plate cylinder) on the treated half.

Plate C was treated similarly to Plate B except that the water soluble protective layer was formed by wiping the plate with a solution of 7% gum arabic and 22% of the sodium salt of sulphonated alkyl diphenyloxide. After "burning-in", this plate was washed with water and then placed on the press. Similar results were obtained in that the treated half of the plate was fully inked after 5 revolutions of the plate cylinder whereas the untreated half gave results which were still not quite acceptable after 100 copies had been produced.

EXAMPLE 2

Similar results to those of Example 1 were obtained by using a pre-inking liquid of the following composition:

2,6-dimethyl-4-heptanone; 15 g
mineral oil; 50 g
asphaltum; 15 g
paraffin wax; 2 g
carbon black; 6 g
phthalocyanine blue; 12 g

EXAMPLE 3

A pre-inking liquid was prepared from:

4-methyl-2-pentanone; 11 g
asphaltum; 16 g
tallow; 2.25 g
paraffin wax; 0.75 g
white spirit; 0.75 g This pigment-free liquid was used in the same manner as in Example 1 but it was applied before exposure of the plate. Once again rapid ink-acceptance was found on the press.

EXAMPLE 4

As a comparison, the pre-inking liquid of Example 3 was made up but with the omission of the 4-methyl-2-pentanone. This liquid was quite ineffective and the resulting plate had no better ink-acceptance than an untreated plate.

EXAMPLE 5

A mixture was prepared comprising:

white spirit; 51 g
light mineral oil; 5 g
neatsfoot oil; 2.5 g
asphaltum; 14.5 g
tallow; 1.8 g
blown castor oil; 1 g
mid litho varnish; 1.2 g
paraffin wax; 0.5 g
carbon black; 10.5 g When this mixture was used as a pre-inking liquid in the manner of Example 1, the plates were in no way improved. However, when 12 g 2,6-dimethyl-4-heptanone were added to the mixture and the experiment was repeated, the resultant plates were fully inked after five revolutions of the press.

EXAMPLE 6

A mixture was prepared comprising:

n - butanol; 4 g
genuine turpentine; 81 g
bees wax; 10 g
phthalocyanine blue pigment; 5 g A positive-working plate comprising a brush grained aluminium support coated with a radiation sensitive mixture of a diazoquinone ester and a novolak resin was exposed, treated with the above pre-inking liquid and further processed in the same way as described in Example I. Similar results were obtained.

EXAMPLE 7

A mixture was prepared comprising:

2-ethoxy ethanol; 8 g
white spirit; 73 g
paraffin wax; 3 g
powdered bitumen; 10 g
phthalocyanine blue pigment; 6 g A positive-working plate consisting of a grained aluminium support coated with a radiation sensitive mixture of a diazo resin p-toluene sulphonate and a novolak resin was exposed, treated with the above pre-inking liquid and further processed in the same way as in Example 1 except that the developer used was an aqueous 5% solution of trisodium phosphate. Similar results were again obtained.

EXAMPLE 8

Example I was repeated using a plate consisting of a grained aluminium support coated with a radiation sensitive mixture of 4'-methoxy-diphenylamine-4-diazonium chloride and a novolak resin and a pre-inking liquid consisting of:

n-hexyl acetate; 2.5 g
white spirit; 76 g
litho varnish; 1.5 g
wax; 10 g
linseed oil; 2 g
carbon black; 4 g
rubine red; 4 g Similar results were again obtained.

EXAMPLE 9

A negative-working plate including a radiation sensitive layer comprising 1-azidopyrene and novolak resin was exposed and after treatment with the pre-inking liquid of Example 1 was developed with a solution of 1% trisodium phosphate and 0.1% anionic surfactant in water. On proceeding as in that Example the plate was found to be fully inked after 6 copies had been run off.

What is claimed is:

1. A composition for improving the ink receptivity of a lithographic printing plate having a printing image formed by alkali-development of an image-wise exposed radiation sensitive layer which composition comprises (i) an organic solvent liquid capable of softening the surface of the printing image, said solvent being selected from the group consisting of alcohols, esters and ketones and comprising from about 2% to 20% by weight of the composition and (ii) a film forming alkali-resistant oleophilic material which is a liquid hydrocarbon solution of a normally solid material selected from the group consisting of hydrocarbons, fats and mixtures of hydrocarbons and fats, said liquid hydrocarbon comprising from about 45% to 85% by weight of the composition and said normally solid material comprising from about 5% to 25% by weight of the composition.

2. A composition as claimed in claim 1 wherein the alcohol is ethanol, iso-propanol, n-butanol, 2-ethyl hexanol or 1-octanol.

3. A composition as claimed in claim 1 wherein the ester is n-hexyl acetate, diethyl phthalate or diethyl carbonate.

4. A composition as claimed in claim 1 wherein the normally solid material comprises gilsonite, bitumen, beeswax, paraffin wax, tallow or mixture of two or more thereof.

5. A composition as claimed in claim 1 and additionally including up to 20% by weight of pigment and/or dye.

6. A method of processing a radiation sensitive plate comprising a layer of radiation sensitive material which is developable by an alkaline developer after image-wise exposure, which method comprises:

(a) image-wise exposing the radiation sensitive layer, (b) treating the image-wise exposed layer with a composition as claimed in claim 1 and (c) developing the treated layer with an alkaline developer to leave an image on the plate.

7. A method according to claim 6 wherein the radiation sensitive layer comprises a mixture of a phenol-formaldehyde resin and a sensitiser.

8. A method according to claim 7 and comprising the additional step of heating the plate after development to a temperature sufficient to burn-in said plate.

9. A method according to claim 8 and comprising the additional step of providing a water soluble layer on the plate after development to prevent contaminating residues from contacting the non-image areas of the plate during the heating step.

10. A radiation sensitive plate comprising a substrate; a coating on the substrate of a radiation sensitive material which is developable by an alkaline developer after image-wise exposure; and, on said coating, a layer of solid alkali resistant oleophilic material.

11. A plate as claimed in claim 10 wherein the radiation sensitive layer comprises a mixture of a phenol formaldehyde resin and a sensitiser and the solid alkali resistant oleophilic material comprises a hydrocarbon, a fat, or a mixture thereof.

12. A composition as claimed in claim 1 wherein the ketone is 2,6-dimethyl-4-heptanone, 3-methyl-2-pentanone or 4-methyl-2-pentanone.

* * * * *